(12) United States Patent
Kwak et al.

(10) Patent No.: US 9,730,369 B2
(45) Date of Patent: Aug. 8, 2017

(54) MAGNETIC SHIELDING SHEET AND MANUFACTURING METHOD THEREOF

(71) Applicant: Electronics and Telecommunications Research Institute, Daejeon (KR)

(72) Inventors: Sang il Kwak, Daejeon (KR); Jong Hwa Kwon, Daejeon (KR); Hyun Ho Park, Hwaseong-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 15/042,722

(22) Filed: Feb. 12, 2016

(65) Prior Publication Data

US 2016/0242332 A1 Aug. 18, 2016

(30) Foreign Application Priority Data

Feb. 16, 2015 (KR) .................. 10-2015-0023304

(51) Int. Cl.
H05K 9/00 (2006.01)

(52) U.S. Cl.
CPC .................. H05K 9/0075 (2013.01)

(58) Field of Classification Search
CPC ... H05K 9/0075; H05K 1/0353; H05K 1/0373
See application file for complete search history.

(56) References Cited

U.S. PATENT DOCUMENTS

| | | | | |
|---|---|---|---|---|
| 3,395,403 A * | 7/1968 | Wu | .................. | G11C 11/06085 365/133 |
| 6,086,979 A * | 7/2000 | Kanbara | .............. | H01J 29/868 174/390 |
| 8,289,109 B2 * | 10/2012 | Yu | .......................... | H01P 1/2005 333/204 |
| 9,144,151 B2 * | 9/2015 | Kosowsky | ............... | C25D 5/54 |
| 2003/0042045 A1 * | 3/2003 | Koskenmaki | .......... | H05B 3/286 174/261 |
| 2005/0216075 A1 * | 9/2005 | Wang | ..................... | A61L 29/18 623/1.15 |
| 2006/0092079 A1 * | 5/2006 | de Rochemont | ...... | H01Q 1/362 343/700 MS |
| 2006/0154052 A1 * | 7/2006 | Waffenschmidt | .... | H05K 1/0373 428/339 |
| 2010/0053013 A1 * | 3/2010 | Konishi | .................. | H01F 10/20 343/772 |
| 2012/0049986 A1 | 3/2012 | Cho et al. | | |

FOREIGN PATENT DOCUMENTS

| | | |
|---|---|---|
| KR | 1020120019219 A | 3/2012 |
| KR | 1020130021263 A | 3/2013 |
| KR | 1020140030446 A | 3/2014 |
| KR | 1020140065702 A | 5/2014 |

\* cited by examiner

Primary Examiner — Michael F McAllister
(74) Attorney, Agent, or Firm — William Park & Associates Ltd.

(57) ABSTRACT

Provided is a magnetic shielding sheet. The magnetic shielding sheet according to an embodiment of the inventive concept may include a magnetic sheet including a magnetic material, a plurality of first metal strips provided on the magnetic sheet in a first direction, and a plurality of second metal strips provided on the magnetic sheet in a second direction different from the first direction. According to the inventive concept, a magnetic field applied from the outside may be efficiently shielded by properly arranging the metal strips on the magnetic sheet.

10 Claims, 9 Drawing Sheets

MAGNETIC SHIELDING SHEET AND MANUFACTURING METHOD THEREOF

CROSS-REFERENCE TO RELATED APPLICATIONS

This U.S. non-provisional patent application claims priority under 35 U.S.C. §119 of Korean Patent Application No. 10-2015-0023304, filed on Feb. 16, 2015, the entire contents of which are hereby incorporated by reference.

BACKGROUND OF THE INVENTION

The present disclosure herein relates to magnetic shielding sheets, and more particularly, to magnetic shielding sheets including metal strips and a magnetic sheet.

In line with an increase in the number of devices using electromagnetic waves, a phenomenon frequently occurs in which people are exposed to the electromagnetic waves in everyday life. In particular, it is difficult to shield or absorb a magnetic field generated from an electromagnetic source with a low-frequency band. In general, an electric field is shielded with a conductor if one wants to shield the electric field. However, if one wants to shield a magnetic field, it is difficult to shield the magnetic field with a metal due to heat loss. Thus, it is in general to shield the magnetic field with a magnetic material with a high magnetic permeability such as ferrite.

Since the material with a high magnetic permeability, such as ferrite, has very low conductivity and high magnetic permeability, it has advantages in that there is almost no heat loss. However, such a magnetic material is relatively expensive and has characteristics in which the magnetic permeability varies according to a frequency.

When a magnetic field is applied to a surface of a metallic material having high conductivity such as aluminum, an eddy current is generated on the surface of the metal by a boundary condition. Heat may be generated on the surface of the metal due to the eddy current, and since another magnetic field is formed in a direction opposite to a direction in which the magnetic field is applied, the two magnetic fields cancel each other. However, in a case in which a magnetic field is shielded with a metal, heat loss may be high when a strong magnetic field is applied.

Thus, the provision of a shielding sheet capable of efficiently shielding a magnetic field (additionally, capable of shielding an electric field) has emerged as an important issue.

SUMMARY OF THE INVENTION

The present disclosure provides a magnetic shielding sheet using a metal strip in combination with a material with a high magnetic permeability, such as ferrite, in order to effectively shield a magnetic field in a low-frequency band.

An embodiment of the inventive concept provides a magnetic shielding sheet including: a magnetic sheet including a magnetic material; a plurality of first metal strips provided on the magnetic sheet in a first direction; and a plurality of second metal strips provided on the magnetic sheet in a second direction different from the first direction.

In an embodiment, the plurality of first metal strips and the plurality of second metal strips may be provided in a plurality of holes or grooves formed in a first surface of the magnetic sheet.

In an embodiment, the plurality of holes or grooves may be formed by physical machining or chemical machining.

In an embodiment, the plurality of first metal strips and the plurality of second metal strips may be provided by a deposition method.

In an embodiment, the plurality of first metal strips and the plurality of second metal strips may be simultaneously provided.

In an embodiment, cross sections of the plurality of first metal strips and the plurality of second metal strips may be rectangular, triangular, or semicircular.

In an embodiment, the first direction and the second direction may be perpendicular to each other.

In an embodiment, the two adjacent first metal strips and the two adjacent second metal strips may be disposed at a same interval from one another.

In an embodiment, the magnetic material may include at least one of a ferrite-based material, a neodymium-based material, a samarium-based material, an alnico-based material, sendust, or permalloy.

In an embodiment, the plurality of first metal strips and the plurality of second metal strips may include at least one of copper, aluminum, or iron.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF PREFERRED EMBODIMENTS

It should be construed that foregoing general illustrations and following detailed descriptions are exemplified and an additional explanation of claimed inventions is provided. Reference numerals are indicated in detail in preferred embodiments of the inventive concept, and their examples are represented in reference drawings. In every possible case, like reference numerals are used for referring to the same or similar elements in the description and drawings.

It will be understood that when an element or layer is referred to as being "connected to", "coupled to", or "adjacent to" another element or layer, it can be directly connected, coupled, or adjacent to the other element or layer, or intervening elements or layers may be present. As used herein, the term "and/or" includes any and all combinations of one or more of the associated listed items.

It will be understood that although the terms "first" and "second" are used herein to describe various elements, these elements should not be limited by these terms. These terms are only used to distinguish one element from another element. Thus, a first element, section, or layer discussed below could be termed a second element, section, or layer without departing from the scope of the inventive concept.

Spatially relative terms, such as "under", "lower", "over", "upper", and the like, include both cases in which one layer may be directly on another layer or intervening layers may be present. It will be understood that the spatially relative terms are intended to encompass different orientations of a device in use or operation in addition to the orientation depicted in the figures. For example, if a device in the figures is inverted, elements described as "under" other elements would then be oriented "over" the other elements.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Hereinafter, preferred embodiments of the inventive concept will be described with reference to the accompanying drawings to fully explain the present invention in such a manner that it may easily be carried out by a person with ordinary skill in the art to which the present invention pertains.

Figure 1:
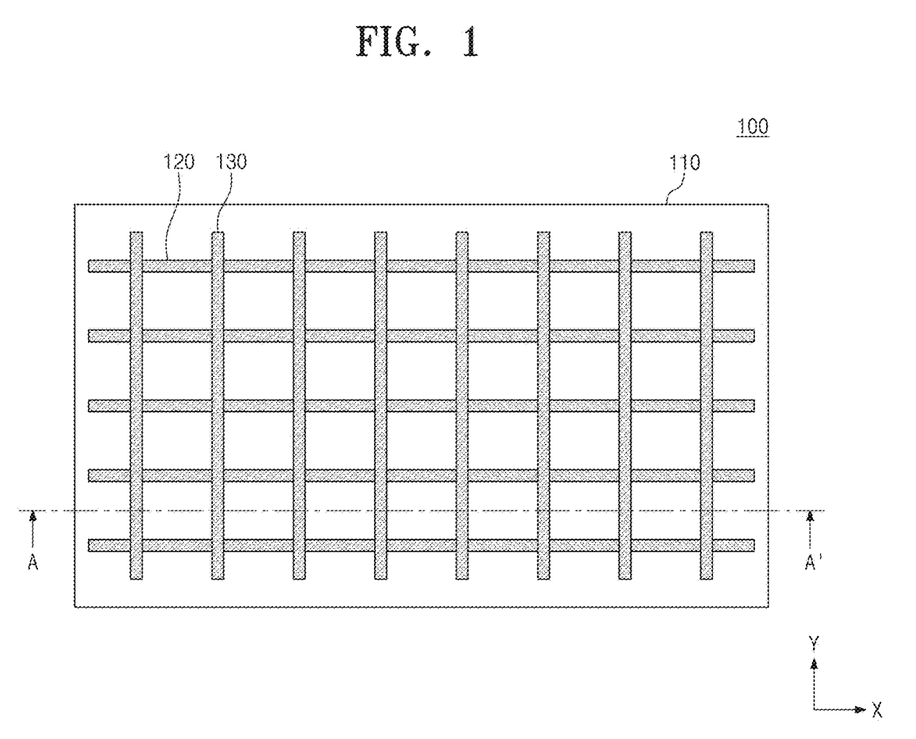
FIG. 1 exemplarily illustrates a magnetic shielding sheet according to an embodiment of the inventive concept.

FIG. 1 exemplarily illustrates a magnetic shielding sheet 100 according to an embodiment of the inventive concept. Referring to FIG. 1, the magnetic shielding sheet 100 may include a magnetic sheet 110, a plurality of first metal strips 120, and a plurality of second metal strips 130.

The magnetic sheet 110 may be a sheet that is formed of a magnetic material. The magnetic sheet 110 may be in the form of a wide thin plate. For example, the magnetic material included in the magnetic sheet 110 may include at least one of a ferrite-based material, a neodymium-based material (Nd—Fe—B), a samarium-based material, an alnico (Al—Ni—Co)-based material, sendust (Fe—Si—Al), or permalloy (Ni—Fe). For example, in the inventive concept, a sheet including a ferrite-based material will be described as an example.

The plurality of first metal strips 120 may be provided on the magnetic sheet 110. As illustrated in FIG. 1, the plurality of first metal strips 120 may be provided in a first direction. In FIG. 1, it is illustrated that the first direction is an X-axis direction. The two adjacent first metal strips may be disposed at a predetermined spacing from each other. However, the spacing between the two adjacent first metal strips may not be constant.

The plurality of first metal strips 120 may be provided in holes or grooves formed in the magnetic sheet 110. The hole may be formed so as to penetrate through the magnetic sheet 110. The groove may be formed so as not to penetrate through the magnetic sheet 110. For example, the plurality of first metal strips 120 may be provided in the holes or the grooves in the magnetic sheet 110 by a deposition method. However, the embodiment of the inventive concept is not limited thereto. The plurality of first metal strips 120 may be molded to fit the holes or the grooves that are formed in the magnetic sheet 110 and may then be coupled to the magnetic sheet 110 by a pressing method.

Alternatively, the plurality of first metal strips 120 may be provided on the magnetic sheet 110 on which a hole or a groove is not formed. For example, the plurality of first metal strips 120 may be coupled to the magnetic sheet 110 by various bonding methods and pressing methods.

The plurality of first metal strips 120 may be a metallic material. For example, the plurality of first metal strips 120 may include at least one of copper (Cu), aluminum (Al), or iron (Fe). However, the embodiment of the inventive concept is not limited thereto, and various metals may be used in which an eddy current may be generated on surfaces thereof by a boundary condition when a magnetic field is applied to the surfaces thereof.

The plurality of second metal strips 130 may be provided on the magnetic sheet 110. As illustrated in FIG. 1, the plurality of second metal strips 130 may be provided on the magnetic sheet 110 in a second direction. The second direction may be a random direction different from the first direction. For example, the second direction may be perpendicular to the first direction. The plurality of second metal strips 130 is similar to the plurality of first metal strips 120 except the direction in which the plurality of second metal strips 130 is provided on the magnetic sheet 110. Thus, the overlapping descriptions thereof will be omitted.

According to an embodiment of the inventive concept, the magnetic sheet including a high magnetic permeability material, such as ferrite, and metal strips are properly arranged to shield a magnetic field applied from the outside. When the magnetic field is applied from the outside, an eddy current is generated on the surface of the metal strip by the electromagnetic boundary condition, and the magnetic field is cancelled by the eddy current. That is, a sheet capable of more efficiently shielding the magnetic field may be provided. In addition, an additional effect of shielding an electric field may be obtained by using the metal strips.

Figure 2:
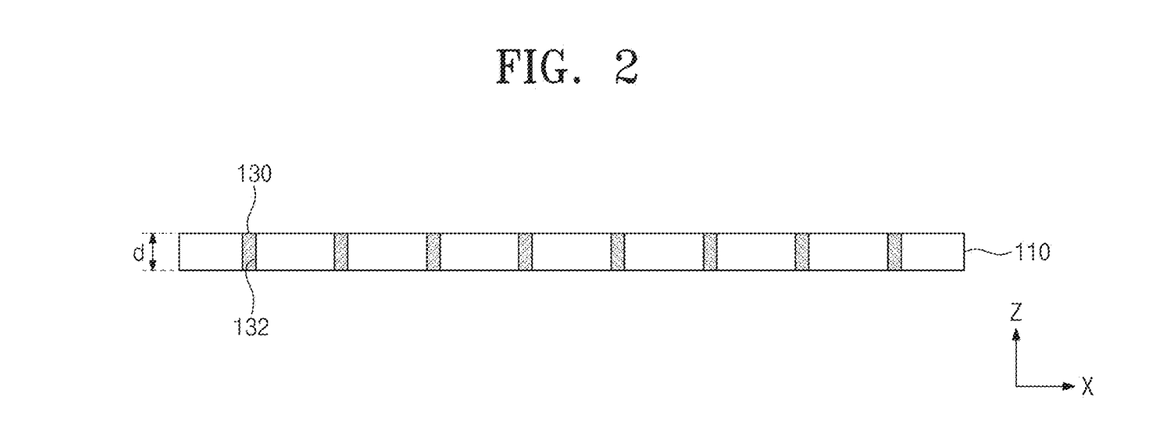
FIG. 2 is a cross-sectional view taken along line A-A' of FIG. 1, according to an embodiment of the inventive concept.

FIG. 2 is a cross-sectional view taken along line A-A' of FIG. 1, according to an embodiment of the inventive concept. FIG. 2 illustrates a case in which the metal strips are provided in holes 132 that are formed in the magnetic sheet 110.

The plurality of holes 132 may be formed in the magnetic sheet 110. The plurality of holes 132 may be formed by physical machining or chemical machining. For example, the plurality of holes 132 may be formed by the physical machining, such as laser machining, punching, pressing, and cutting, or the chemical machining such as dry etching and wet etching. The plurality of holes 132 may be formed to completely penetrate through the magnetic sheet 110.

The plurality of second metal strips 130 may be molded to fit the holes 132 that are formed in the magnetic sheet 110 and may then be coupled to the magnetic sheet 110 by a pressing method. Although the plurality of first metal strips is not illustrated in FIG. 2, the foregoing descriptions are equally applicable to the first metal strips.

Figure 3:
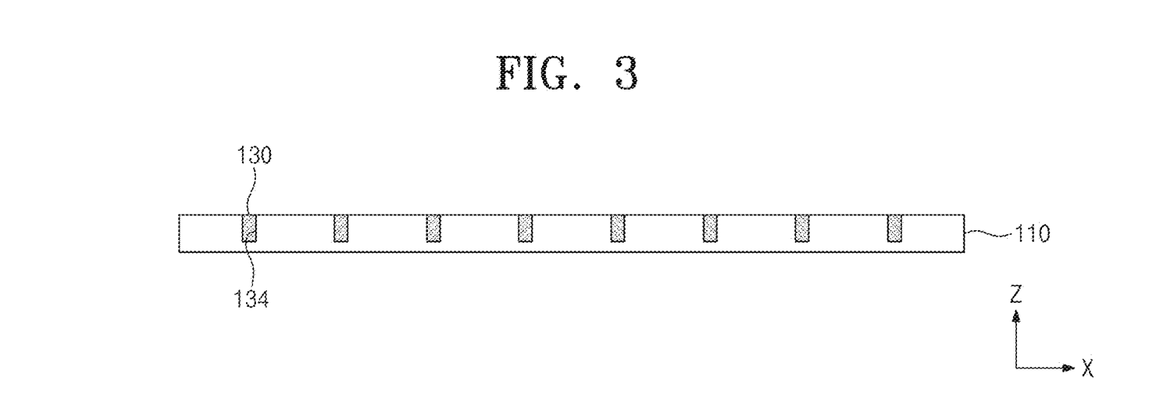
FIG. 3 is a cross-sectional view taken along line A-A' of FIG. 1, according to another embodiment of the inventive concept.
Figure 4:
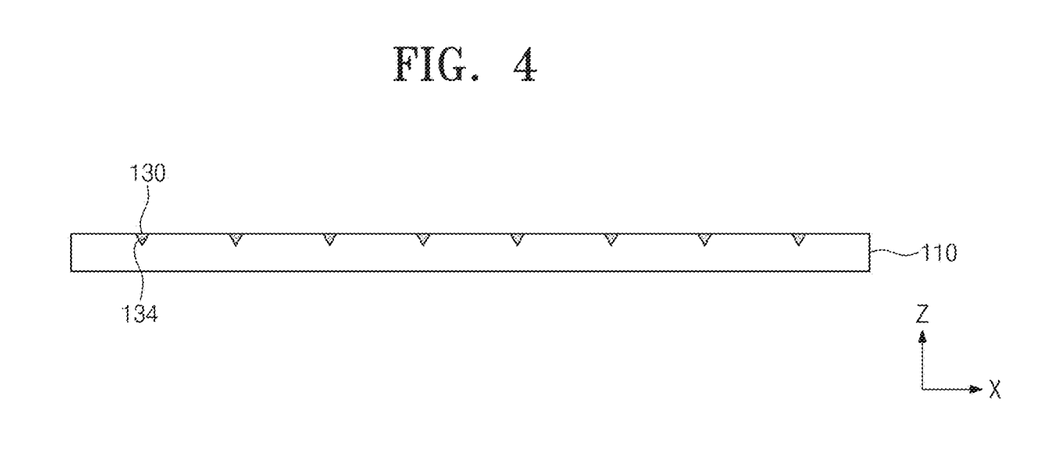
FIG. 4 is a cross-sectional view taken along line A-A' of FIG. 1, according to another embodiment of the inventive concept.

FIGS. 3 and 4 are cross-sectional view taken along line A-A' of FIG. 1, according to another embodiments of the inventive concept. FIGS. 3 and 4 illustrate cases in which metal strips are provided in grooves 134 that are formed in the magnetic sheet 110.

The plurality of grooves 134 may be formed in the magnetic sheet 110.

The plurality of grooves 134 may be formed by physical machining or chemical machining. For example, the plurality of grooves 134 may be formed by the physical machining, such as laser machining, punching, pressing, and cutting, or the chemical machining such as dry etching and wet etching. The plurality of grooves 134 may be formed so as not to penetrate through the magnetic sheet 110.

The plurality of first metal strips 120 (see FIG. 1) and the plurality of second metal strips 130 may be provided in the grooves 134. For example, the plurality of first metal strips 120 (see FIG. 1) and the plurality of second metal strips 130 may be provided on the magnetic sheet 110 by a deposition method such as sputtering. Also, the plurality of first metal strips 120 (see FIG. 1) and the plurality of second metal strips 130 may be molded to fit the grooves that are formed in the magnetic sheet 110 and may then be coupled to the magnetic sheet 110 by a pressing method.

In FIG. 3, it is illustrated that a cross section of the metal strips is rectangular. However, the embodiment of the inventive concept is not limited thereto, and the cross section of the metal strips may be a triangular as illustrated in FIG. 4 or may be in various shapes such as semicircular (not shown).

Figure 5:
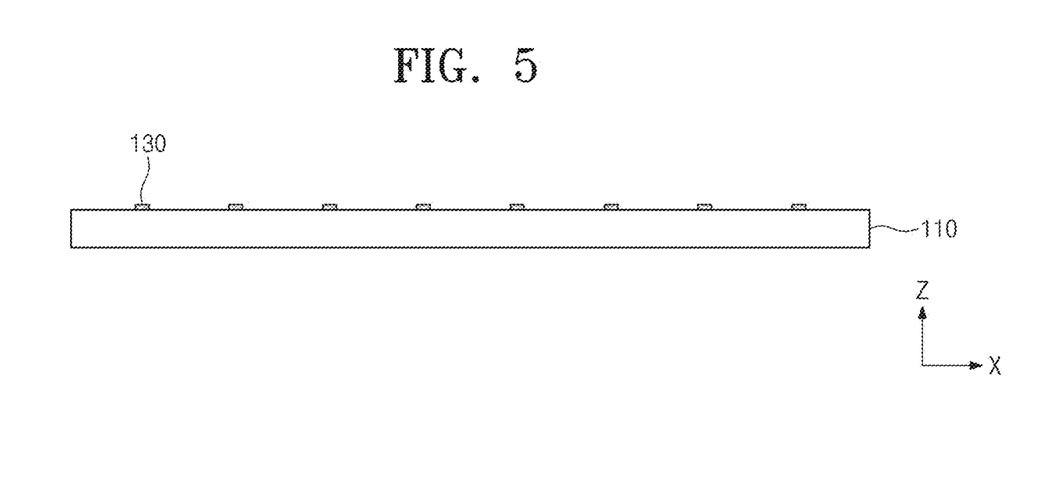
FIG. 5 is a cross-sectional view taken along line A-A' of FIG. 1, according to another embodiment of the inventive concept.

FIG. 5 is a cross-sectional view taken along line A-A' of FIG. 1, according to another embodiment of the inventive concept.

The plurality of first metal strips 120 (see FIG. 1) and the plurality of second metal strips 130 may be provided on the magnetic sheet 110 in which a hole or a groove is not formed. The plurality of first metal strips 120 (see FIG. 1) and the plurality of second metal strips 130 may be coupled to the magnetic sheet 110 by various bonding methods or pressing methods.

Figure 6:
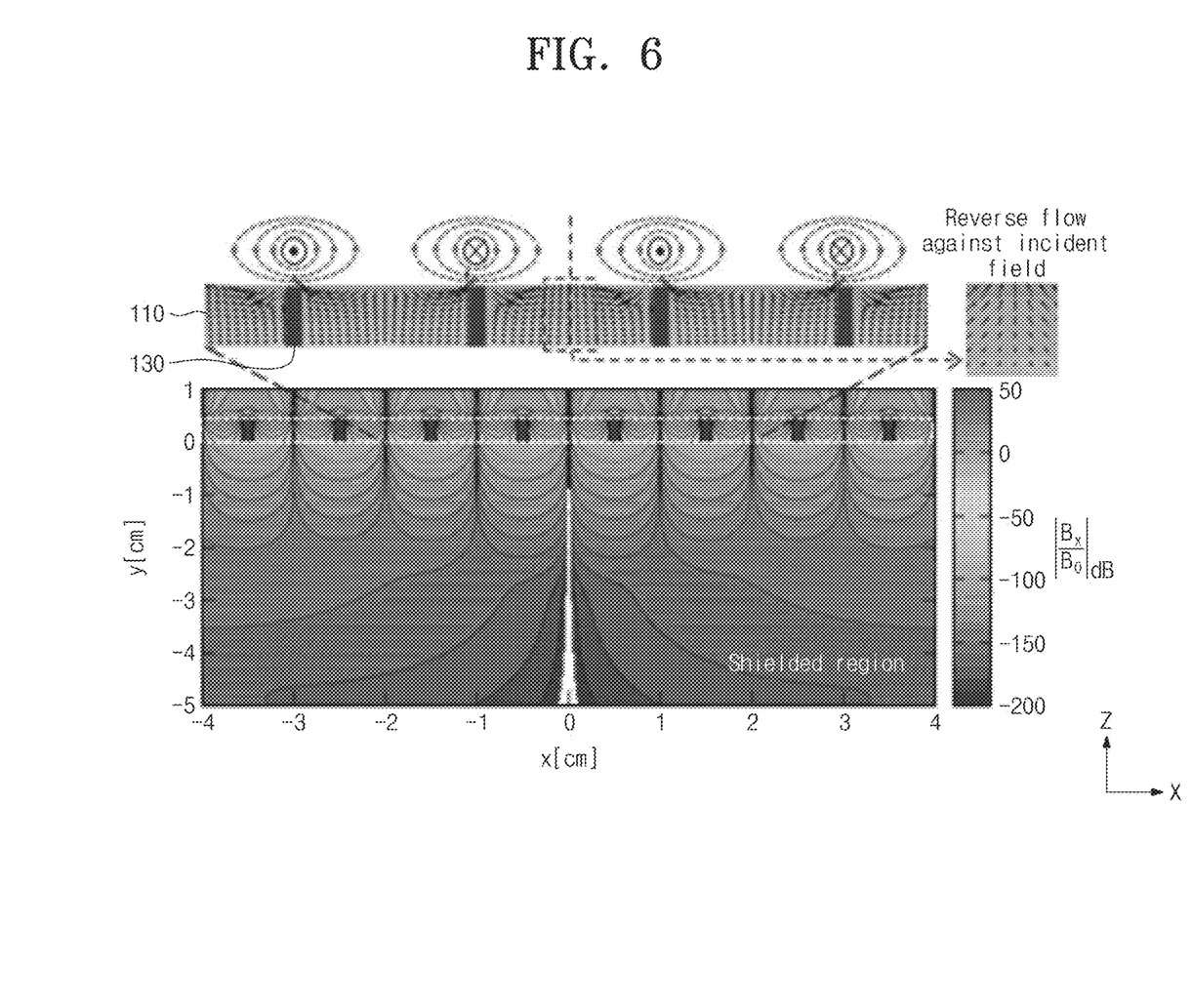
FIG. 6 illustrates that the magnetic shielding sheet according to the embodiment of the inventive concept shields an external magnetic field.

FIG. 6 illustrates that the magnetic shielding sheet according to the embodiment of the inventive concept shields an external magnetic field.

A horizontal axis and a vertical axis of FIG. 6 represent a relative position of the magnetic shielding sheet. For example, the magnetic shielding sheet is disposed between a horizontal axis coordinate of about −4 to about 4 and a vertical axis coordinate of about 0 to about 0.5. A region between the horizontal axis coordinate of about −4 to about 4 and the vertical axis coordinate of about −4 to about 0 is a shield region. A magnetic field source is disposed at the outside (any point with the vertical axis coordinate of about 0.5 or more). Herein, the unit of the coordinates is centimeter (cm).

Shaded parts of FIG. 6 represent relative strengths of the magnetic field. That is, the shaded parts represent decibel (dB) values of a ratio of strength ($B_x$) of magnetic flux density in the shield region to strength ($B_0$) of magnetic flux density due to the magnetic field source. In the shield region, it is denoted that the lower the concentration of the shade is (i.e., closer to the vertical axis coordinate of about 0), the relatively higher the strength of the magnetic field is, and the higher the concentration of the shade is (i.e., closer to the vertical axis coordinate of about −5), the relatively lower the strength of the magnetic field is.

Referring to FIG. 6, the magnetic field is applied from the outside of the magnetic shielding sheet in a direction of Y-axis or −Y-axis. When the magnetic field is applied, the magnetic field applied from the outside is focused by the magnetic sheet 110 including a ferrite material. The focusing of the magnetic field is represented by small arrows in FIG. 6. When each of the metal strips 130 encounters the focused magnetic field, an eddy current is generated on the surfaces of the metal strips 130 by the electromagnetic boundary condition. The magnetic field is canceled by the eddy current.

Results due to the magnetic field cancelation are illustrated in the shades in different concentrations in FIG. 6. That is, it may be understood that a decibel (dB) value of the strength ($B_0$) of internal magnetic flux density with respect to the strength ($B_x$) of external (the vertical axis coordinate of about 0.5 or more) magnetic flux density is rapidly decreased starting from the magnetic shielding sheet (the vertical axis coordinate of about 0 to about 0.5). It may also be understood that the decibel value gradually decreases as it moves toward the inside (i.e., the vertical axis coordinate of about 0 or less) of the shield region.

Figure 7:
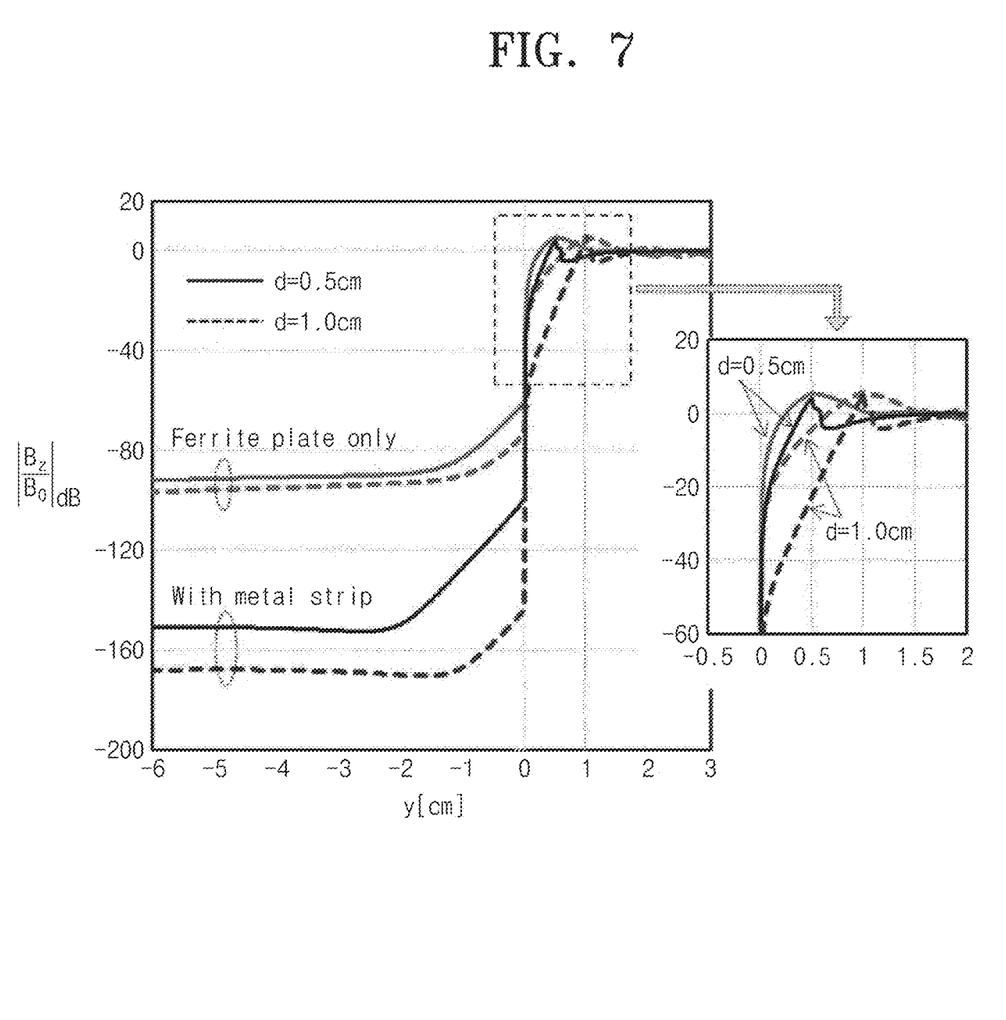
FIG. 7 is a graph illustrating the strength of magnetic flux density according to the presence of a metal strip and a thickness of a magnetic shielding sheet.

FIG. 7 is a graph illustrating the strength of magnetic flux density according to the presence of a metal strip and a thickness of a magnetic shielding sheet.

An X-axis illustrated in the graph of FIG. 7 corresponds to the Y-axis of FIG. 6. That is, an X-axis coordinate of about 0 to about 0.5 (case in which d=0.5 cm) or about 0 to about 1 (case in which d=1 cm) corresponds to a position in which the magnetic shielding sheet according to the embodiment of the inventive concept is disposed. The X-axis coordinate of about −6 to about 0 corresponds to the shield region.

First, with respect to a magnetic shielding sheet including only the magnetic sheet without a metal strip, it may be understood that a decibel value of strength ($B_0$) of internal magnetic flux density with respect to strength ($B_y$) of external magnetic flux density is decreased as the thickness of the magnetic shielding sheet is increased. However, even if the thickness of the magnetic shielding sheet is increased from about 0.5 cm to about 1 cm, a change in the decibel value is insignificant.

In contrast, with respect to a magnetic shielding sheet including both the magnetic sheet and the metal strips, it may be understood that the decibel value is rapidly decreased. The reason for this is that a significant amount of the magnetic field is canceled or shielded by a boundary condition that is generated by the provided metal strips.

According to an embodiment of the inventive concept, the magnetic sheet including a high magnetic permeability material and the metal strips are properly arranged to provide a sheet shielding a magnetic field applied from the outside. Since the metal strips as well as the magnetic sheet are disposed together, an eddy current is generated on the surface of the metal strip by the electromagnetic boundary condition. The magnetic field applied from the outside is cancelled by the eddy current. That is, a sheet capable of more efficiently shielding the magnetic field may be provided. In addition, the additional effect of shielding an electric field may be obtained by using the metal strips.

Figure 8:
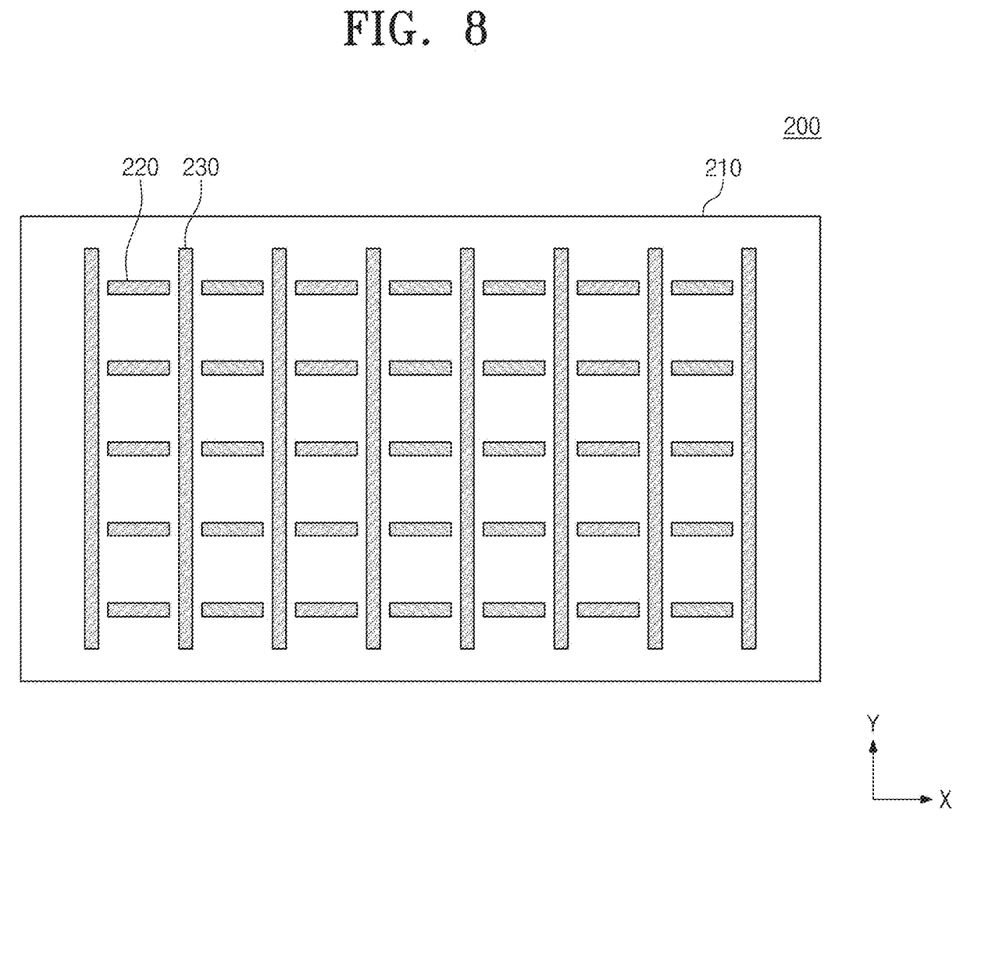
FIG. 8 illustrates a layout of a magnetic shielding sheet according to another embodiment of the inventive concept.

FIG. 8 illustrates a layout of a magnetic shielding sheet 200 according to another embodiment of the inventive concept. Referring to FIG. 8, the magnetic shielding sheet 200 may include a magnetic sheet 210, a plurality of first metal strips 220, and a plurality of second metal strips 230.

The plurality of first metal strips 220, as illustrated in FIG. 8, may be disposed between the plurality of second metal strips 230. A length of the plurality of first metal strips 220 may be relatively smaller than a length of the plurality of second metal strips 230. When the layout of the metal strips is designed as in FIG. 8, the magnetic sheet 210 may not be separated even if holes for the metal strips are formed in the magnetic sheet 210.

Figure 9:
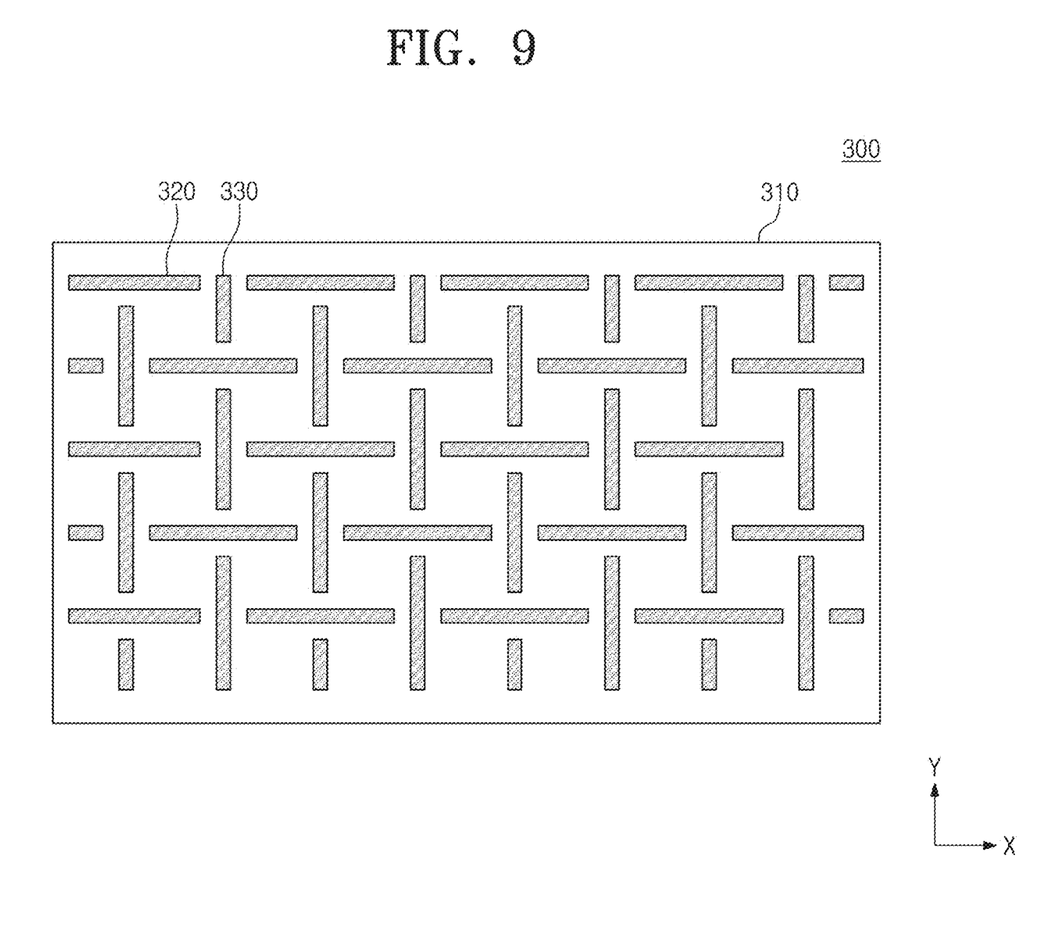
FIG. 9 illustrates a layout of a magnetic shielding sheet according to another embodiment of the inventive concept.

FIG. 9 illustrates a layout of a magnetic shielding sheet 300 according to another embodiment of the inventive concept. Referring to FIG. 9, the magnetic shielding sheet 300 may include a magnetic sheet 310, a plurality of first metal strips 320, and a plurality of second metal strips 330.

As illustrated in FIG. 9, each of the plurality of first metal strips 320 may be disposed between the two adjacent second metal strips which are disposed on the same line. The plurality of first metal strips 320 may be disposed in a direction perpendicular to a direction in which the plurality of second metal strips 330 is disposed. Similarly, each of the plurality of second metal strips 330 may be disposed between the two adjacent first metal strips which are disposed on the same line.

When the layout of the metal strips is designed as in FIG. 9, the magnetic sheet 310 may not be separated even if holes for the metal strips are formed in the magnetic sheet 310.

Figure 10:
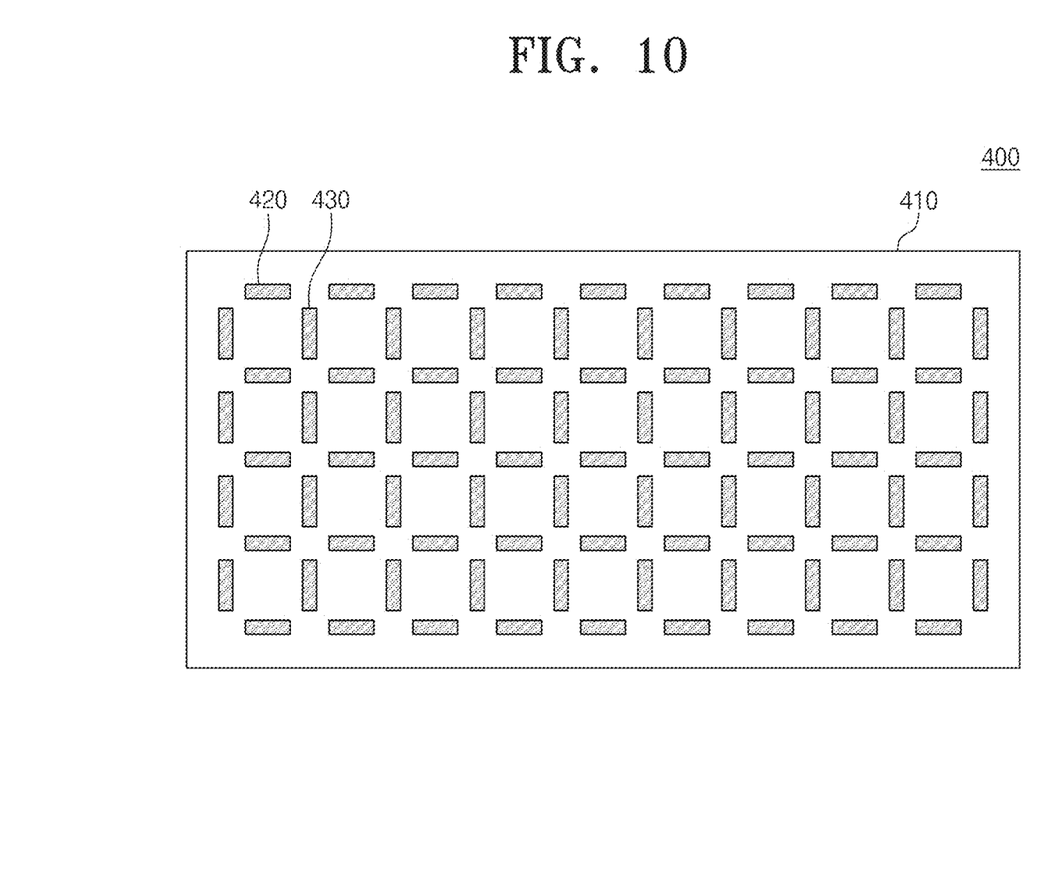
FIG. 10 illustrates a magnetic shielding sheet according to another embodiment of the inventive concept.

FIG. 10 illustrates a magnetic shielding sheet 400 according to another embodiment of the inventive concept. Referring to FIG. 10, the magnetic shielding sheet 400 may include a magnetic sheet 410, a plurality of first metal strips 420, and a plurality of second metal strips 430.

As illustrated in FIG. 10, the plurality of first metal strips 420 and the plurality of second metal strips 430 may be disposed in the form of a grid. Both ends of each of the plurality of metal strips may not be in contact with one end of the other adjacent metal strips.

When the layout of the metal strips is designed as in FIG. 10, the magnetic sheet 410 may not be separated even if holes for the metal strips are formed in the magnetic sheet 410.

Figure 11:
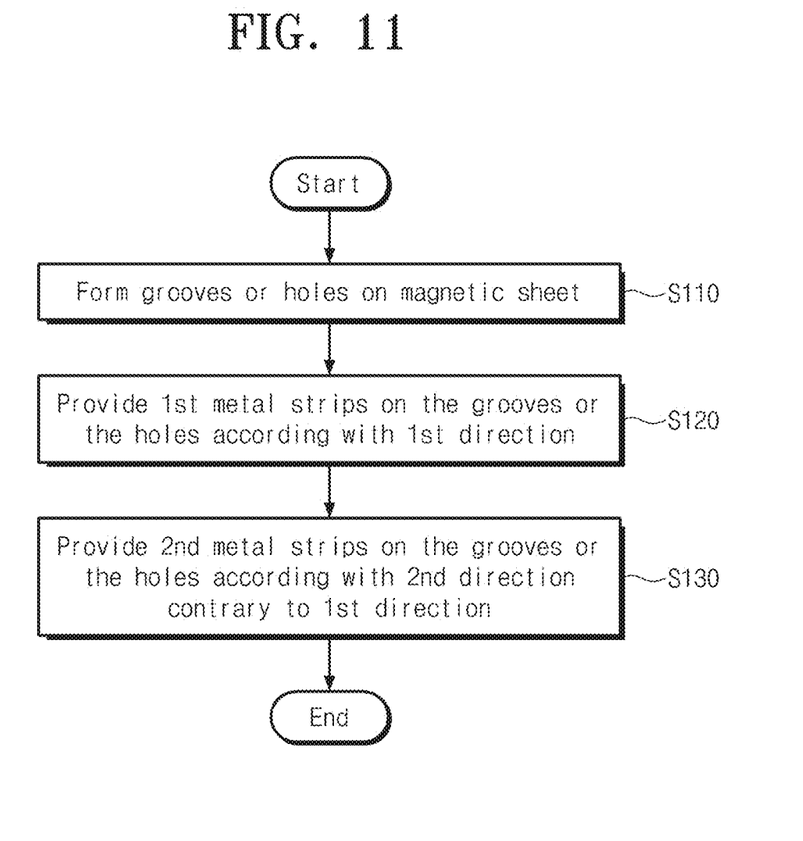
FIG. 11 is a flowchart illustrating a method of manufacturing a magnetic shielding sheet according to an embodiment of the inventive concept.

FIG. 11 is a flowchart illustrating a method of manufacturing a magnetic shielding sheet according to an embodiment of the inventive concept.

In S110, a plurality of holes or grooves may be formed in a first surface of a magnetic sheet. However, in a case in which the plurality of grooves is formed, grooves may be formed in a second surface opposite to the first surface of the magnetic sheet. The plurality of holes may be formed so as to penetrate through the magnetic sheet, and the plurality of grooves may be formed so as not to penetrate through the magnetic sheet. S110 may be performed by physical machining, such as laser machining, punching, pressing, and cutting, or chemical machining such as dry etching and wet etching.

A portion of the plurality of holes or grooves may be formed in a first direction of the magnetic sheet, and the remaining portion thereof may be formed in a second direction different from the first direction. For example, the first direction and the second direction may be perpendicular to each other.

In S120, first metal strips may be provided. The first metal strips may be provided in the holes or the grooves which are formed in the first direction among the plurality of holes or grooves. S120 may be performed by a deposition method such as sputtering. Also, the first metal strips are molded to fit the holes or the grooves formed in the first direction, and S120 may then be performed by a pressing method.

In S130, second metal strips may be provided. The second metal strips may be provided in the holes or the grooves which are formed in the second direction among the plurality of holes or grooves. Similar to the first metal strips, S130 may be performed by a deposition or pressing method. However, when the metal strips are provided by the deposition method, S120 and S130 may be performed at the same time.

According to an embodiment of the inventive concept, a magnetic field applied from the outside may be efficiently shielded or cancelled by properly arranging the metal strips on the magnetic sheet. Also, an additional effect of shielding an electric field may be obtained by using the metal strips.

According to an embodiment of the inventive concept, a magnetic field may be more effectively shielded by using a magnetic shielding sheet in which a high magnetic permeability material, such as ferrite, and metal strips are combined. In addition, the additional effect of shielding an electric field may be obtained by using the metal strips.

While specific embodiment of the inventive concept have been shown and described, it should be apparent that many modifications can be made thereto without departing from the spirit and scope of the inventive concept. Therefore, the scope of the invention concept should not be limited to the above-described embodiments but should be determined by not only the appended claims but also the equivalents thereof.

What is claimed is:

1. A magnetic shielding sheet comprising:
   a magnetic sheet including a magnetic material;
   a plurality of first metal strips extending on the magnetic sheet in a first non-zigzag straight line direction; and
   a plurality of second metal strips extending on the magnetic sheet in a second non-zigzag straight line direction different from the first direction,
   wherein each first metal strip and each second metal strip are without apertures therein.

2. The magnetic shielding sheet of claim 1, wherein the plurality of first metal strips and the plurality of second metal strips are provided in a plurality of holes or grooves formed in a first surface of the magnetic sheet.

3. The magnetic shielding sheet of claim 2, wherein the plurality of holes or grooves is formed by at least one of laser machining, punching, pressing, cutting, dry etching, or wet etching.

4. The magnetic shielding sheet of claim 3, wherein the plurality of first metal strips and the plurality of second metal strips are provided by a deposition method.

5. The magnetic shielding sheet of claim 4, wherein the plurality of first metal strips and the plurality of second metal strips are simultaneously provided.

6. The magnetic shielding sheet of claim 2, wherein cross sections of the plurality of first metal strips and the plurality of second metal strips are rectangular, triangular, or semicircular.

7. The magnetic shielding sheet of claim 1, wherein the first non-zigzag straight line direction and the second non-zigzag straight line direction are perpendicular to each other.

8. The magnetic shielding sheet of claim 6, wherein the two adjacent first metal strips and the two adjacent second metal strips are disposed at a same interval from one another.

9. The magnetic shielding sheet of claim 1, wherein the magnetic material comprises at least one of a ferrite-based material, a neodymium-based material, a samarium-based material, an alnico-based material, sendust, or permalloy.

10. The magnetic shielding sheet of claim 9, wherein the plurality of first metal strips and the plurality of second metal strips comprise at least one of copper, aluminum, or iron.

* * * * *